United States Patent [19]

Young et al.

[11] 4,224,735
[45] Sep. 30, 1980

[54] METHOD OF PRODUCTION MULTIFILAMENTARY INTERMETALLIC SUPERCONDUCTORS

[75] Inventors: Morris S. Young, Murray Hill; William G. Marancik, Basking Ridge, both of N.J.

[73] Assignee: Airco, Inc., Montvale, N.J.

[21] Appl. No.: 23,103

[22] Filed: Mar. 23, 1979

Related U.S. Application Data

[63] Continuation of Ser. No. 832,498, Sep. 12, 1977, abandoned.

[51] Int. Cl.³ ............................................. H01L 39/24
[52] U.S. Cl. ................................ 29/599; 148/11.5 Q; 148/11.5 R
[58] Field of Search .................... 29/599; 428/630; 148/11.5 Q, 11.5 R

[56] References Cited

U.S. PATENT DOCUMENTS

| | | | |
|---|---|---|---|
| 3,570,118 | 3/1971 | Reynolds | 29/599 |
| 3,623,221 | 11/1971 | Morton et al. | 29/599 |
| 3,625,662 | 12/1971 | Roberts et al. | 29/599 X |
| 3,710,000 | 1/1973 | Shattes et al. | 29/599 X |
| 3,778,894 | 12/1973 | Kono et al. | 29/599 |
| 3,829,963 | 8/1974 | McDougall et al. | 29/599 |
| 3,838,503 | 10/1974 | Suenaga et al. | 29/599 |
| 3,905,839 | 9/1975 | Hashimoto | 29/599 |
| 3,918,998 | 11/1975 | Marancik et al. | 29/599 X |
| 3,954,572 | 5/1976 | Ziegler et al. | 29/599 X |
| 3,996,661 | 12/1976 | Ziegler et al. | 29/599 |
| 4,037,313 | 7/1977 | Wilhelm | 29/599 |
| 4,043,028 | 8/1977 | Koike et al. | 29/599 |
| 4,053,976 | 10/1977 | Scanlan et al. | 29/599 |

FOREIGN PATENT DOCUMENTS

| | | | |
|---|---|---|---|
| 2128231 | 1/1973 | Fed. Rep. of Germany | 29/599 |
| 1435459 | 5/1976 | United Kingdom | 29/599 |

OTHER PUBLICATIONS

Ervens, W., "Fabrication and Properties of Multifilament Nb₃Sn Conductors", Z. Metallk., 66 (12): 711–714 (Dec. 1975), translated by Airco, Inc. Information Center; Murray Hill, N.J.

Primary Examiner—Francis S. Husar
Assistant Examiner—Kenneth J. Ramsey
Attorney, Agent, or Firm—Edmund W. Bopp; Larry R. Cassett

[57] ABSTRACT

A method of making A-15 type intermetallic superconductors is disclosed which features elimination of numerous annealing steps. Nb or V filaments are embedded in Cu matrices; annular layers of Sn or Ga, respectively, separated from each other by Cu layers, provide the other component of the intermetallic superconductors $Nb_3Sn$ and $V_3Ga$.

1 Claim, 5 Drawing Figures

METHOD OF PRODUCTION MULTIFILAMENTARY INTERMETALLIC SUPERCONDUCTORS

This is a continuation of application Ser. No. 832,498 filed Sept. 12, 1977, now abandoned.

FIELD OF THE INVENTION

The invention relates to the manufacture of multi-filamentary intermetallic superconductors of the A-15 type. More particularly, the invention provides a method whereby $Nb_3Sn$ and $V_3Ga$ conductors can be made without frequent intermediate annealing steps, thus reducing their cost.

BACKGROUND OF THE INVENTION

The field of superconductivity has been expanding rapidly in recent years due in large part to the discovery of materials which retain the supperconductive property at usefully high current levels, temperatures, and external magnetic fields. Among the more useful materials are $Nb_3Sn$ and $V_3Ga$, both intermetallic compounds having the so-called A-15 crystal structure. While these materials can be made in useful shapes and quantities, they are nevertheless expensive to produce, due to the fact that they are metastable phases which cannot be made by simple chemical processes, and because they are extremely brittle and therefore cannot, once made, be worked to any great extent.

The method now most widely used to make $Nb_3Sn$ and $V_3Ga$ is the "bronze process", whereby Nb or V is brought into contact with a bronze made up of copper and Sn or Ga, respectively. The composite thus formed is worked to its desired shape and subjected to a long-term, high temperature heat-treatment, whereby the Sn or Ga diffuses through the Cu to form $Nb_3Sn$ or $V_3Ga$ at the interface(s) between the Nb or V and the bronze.

It being well-known in the art that superconductors perform better when the superconductive material is divided between a number of extremely fine wires embedded in a metallic matrix, the aim of the art has been to develop methods of making such multi-filamentary conductors. The bronze process described above has been proven capable of modification to suit this goal; an example of a workable process is discussed in U.S. Pat. No. 3,918,988, assigned to the assignee of the present invention. A typical process for the manufacture of a multi-filamentary $Nb_3Sn$ conductor begins with the drilling of a plurality of holes in a Cu/Sn bronze billet for the insertion of Nb rods. This billet is then extruded to a rod, which is then drawn down to fine wire. In some cases it is desirable that even more filaments be produced; this can be done by cutting the rod into a large number of equal lengths at some intermediate size, inserting these into an extrusion can, extruding this assembly and drawing the result to fine wire. The rod may be drawn through a hex-shaped die prior to cutting; if the rod is thus hexed, the lengths pack together with less wasted space.

In some cases it is desirable that there be provided a quantity of pure copper of good electrical conductivity. This may be done by lining a copper extrusion can with a layer of a metal which is impermeable to tin, during high temperature heat-treatment, so that the tin does not diffuse into the copper and lower its conductivity; tantalum is the metal most commonly used. See, e.g., U.S. Pat. No. 3,996,661. A quantity of a good electrical conductor in close proximity to the superconductive material is useful as an alternate current path or shunt in situations where it is likely that some fraction of the superconductive filaments will return to the normally-conducting state, which can happen, for example, in a rapidly-varying magnetic field.

The present state of the art, as outlined above, uses the bronze process to achieve multi-filamentary intermetallic superconductors which are "stabilized" by the provision of a quantity of a good electrical conductor. However, the bronze process is not without its difficulties. Chief among these is the fact that in order to improve the maximum current density carried by the superconductor, it is desirable to increase the amount of superconductive material per unit of cross-sectional area of the whole conductor. To do this it is clear that a sufficiency of tin must be provided, which could be done simply by increasing the percentage of tin in the bronze. Unfortunately, the production of a large number of extremely fine filaments demands a large number of metal-working steps—chiefly drawing—during which the bronze workhardens very quickly, necessitating frequent time-consuming and costly annealing operations. In fact, the practical maximum volume percentage of tin in the bronze which permits working is 15%; and even at this relatively low value, annealing is required roughly every two to six drawing operations, at a rate of 15-20% area reduction per pass.

A number of possible solutions to this problem have been suggested by the prior art. One such, described in U.S. Pat. No. 3,918,998, mentioned above, involves performing the drawing operations at a temperature of above about 100° C. This method increases the number of drawing steps possible between anneals to between ten and fourteen, but is rather cumbersome, especially with larger coils of wire.

A second possibility is disclosed in U.S. Pat. No. 3,838,503. This approach is to simply draw Nb or V wires in a pure copper matrix to the final size desired, and only then adding Sn or Ga to the external surface of the wire, typically by electroplating. Upon heat treatment, the Sn or Ga is diffused through the copper and forms the desired intermetallic compound on the surface of the Nb or V filaments.

This method is not without utility, but is severely limited in that only a very thin layer of Sn or Ga can be applied by conventional dipping, electroplating or vapor deposition processes, thus limiting the size of the conductor which can be produced. An improvement on this method, which has been suggested in U.S. Pat. No. 3,829,963, is to perform a number of such dipping or plating steps and following these by homogenizing steps, thus gradually building up the amount of Sn or Ga in the bronze. However, this process is rather complicated, and is limited as to the size of the conductor which can be effectively permeated with Sn or Ga.

Yet another alternative is described in U.S. Pat. No. 3,954,572. If it is desired to manufacture $Nb_3Sn$, for example, a number of Nb rods will be inserted into a Cu matrix. This assembly is then worked to a fine wire, and a Cu/Sn bronze is electroplated on the surface of the wire. Upon heat-treatment, the Sn diffuses towards the Nb to form $Nb_3Sn$. This method is, however, limited by the amount of tin which can be readily applied. A similar method is discussed in Erwens, *Fabrication and Properties of Multifilament $Nb_3Sn$ Conductors*, Z. Metallk. 66 (12):711-14 (December 1975); it too limited in that the maximum thickness of tin which can be applied is approximately 30 μm.

U.S. Pat. No. 4,037,313 shows a method for forming Nb$_3$Sn which involves depositing tin on the surface of a copper wire in which are embedded Nb filaments by physical vapor deposition. The Cu/Nb wire is suspended over a tub of molten tin in a heated chamber under reduced pressure. This treatment requires a long time to perform (between 45–100 hours) and is not suitable for the production of long lengths of conductor as each individual wire must have a maximum amount of its surface exposed to the tin vapor; this necessitates a spoke-wheel arrangement which is very complicated for long conductors.

Given the state of the art as outlined above, it will be apparent that there exists a distinct need for a method of making a multi-filamentary superconductor of the Nb$_3$Sn or V$_3$Ga type which does not involve the mechanical working of bronze and which enables the manufacture of large conductors.

OBJECTS OF THE INVENTION

It is therefore an object of the invention to provide a simplified and versatile method whereby a superconductor can be made at lower cost.

Another object of the invention is to provide a method of making a multi-filamentary Nb$_3$Sn or V$_3$Ga superconductor which does not require annealing steps.

Still another object of the invention is to provide a method of making a superconductor which does not involve the mechanical deformation of bronze.

Other aspects and objects of the invention will no doubt appear to those skilled in the art.

SUMMARY OF THE INVENTION

The objects of the invention and the needs of the art discussed above are satisfied by the present invention, which envisions a stock product consisting of a Cu core in which is embedded at least one filament of Nb or V, and which is surrounded by alternating annular cylinders of Sn or Ga, respectively, and of copper. The layers of Sn or Ga are no more than 0.50 mm. thick. If the core is so large that this dimension provides insufficient Sn or Ga, plural layers are used. This stock product may be drawn to a given size, and cut into lengths, which may then be packed into an extrusion can, extruded and drawn. At a selected final size, at least one heat-treatment step is performed, whereupon the Sn or Ga diffuses through the Cu to form Nb$_3$Sn or V$_3$Ga, respectively, around the filaments of Nb or V, embedded in a bronze matrix.

BRIEF DESCRIPTION OF THE DRAWINGS

The invention will be better understood if reference is had to the accompanying drawings, in which.

DESCRIPTION OF THE PREFERRED EMBODIMENTS

The method of the invention may be construed to some extent as an improvement on the prior art as outlined above. Therefore, the invention will be described in terms of but a few of many possible arrangements.

Figure 1:
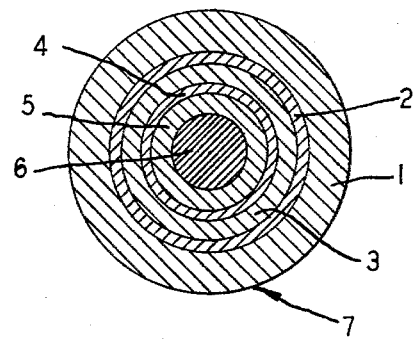
FIG. 1 represents a cross-sectional view of a monofilamentary stock product.

In FIG. 1 there is depicted a cross-sectional view of a monofilamentary conductor precursor 7. A niobium rod 6 is encased by a copper sheath 5, which is in turn covered with a tin layer 4, next covered by a second copper sheath 3, which is also sheathed in tin 2, with a copper layer 1 overall. The tin used to form the layers may be up to 20% copper by volume, to increase its drawability. Such a precursor may be drawn to size and heat-treated, whereupon the tin 2, 4 diffuses through the copper 1, 3, 5 and forms a layer of Nb$_3$Sn on the Nb core 6, which would be completely encased in bronze.

Prior to extrusion and work the Nb rod 6 might be roughly 12 mm in diameter, the Cu tubing wall thicknesses 1.0 mm, and the tin layers approximately 0.50 mm thick.

Figure 2:
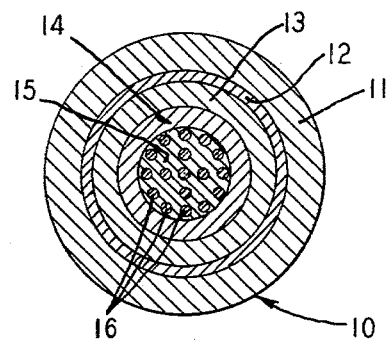
FIG. 2 represents a cross-sectional view of a multi-filamentary stock product.

Normally, however, it is preferable to manufacture superconductors having large numbers of filaments. FIG. 2 shows one way in which the structure of FIG. 1 may be modified to yield such a result; the central Nb rod 6 of FIG. 1 is replaced with a Cu rod 15 having a large number of Nb rods 16 embedded therein; this rod 15 is then encased by alternating layers of Sn 14, 12 and of Cu 13 and 11, to form a multi-filamentary superconductor precursor rod 10.

One method of making a superconductor of the A-15 type which has been suggested in the prior art is disclosed by U.S. Pat. No. 3,570,118. There alternate layers of niobium and tin were wrapped around a central Cu rod and enclosed in a Cu pipe. This method is not suitable for large-scale production of Nb$_3$Sn, as it features direct contact between the Nb and the Sn, which will react to form Nb$_3$Sn due to high local temperatures encountered during extrusion. (Extrusion before drawing is preferred over drawing exclusively, as the reduction ratios available, up to 10:1, result in extremely good bonding of the composite's components. Moreover, much time can be saved by extrusion). As mentioned above, Nb$_3$Sn is extremely brittle, and therefore no subsequent working may be performed. If the Sn layers are no more than about 0.50 mm thick, and are isolated from the Nb by a layer of copper by the method of the invention, extrusion is possible.

A second possibility is suggested by U.S. Pat. No. 3,905.839, where a number of Nb rods are disposed around a core of Sn, or of an alloy of up to 20% Cu, balance Sn, in a copper billet. Alternatively a number of Sn rods enclosed in copper are disposed in a ring around a number of Nb rods embedded in a copper billet. The composite is then drawn to fine wire, whereupon it is heat-treated to form Nb$_3$Sn filaments in a bronze matrix. This method has several inherent deficiencies. In both alternatives, rods of tin are to be coreduced along with copper and niobium. As the tin is much softer and has a lower melting point than the copper and niobium metals, it is not possible to extrude this composite; all coreduction must be achieved by drawing. This limits the continuous length of conductor which can be made, as drawing can only be performed on rods up to a given size. Furthermore, the fact that the tin, in the second alternative mentioned, is disposed in a discontinuous ring around the copper/niobium core means that, for a given amount of tin to be present, the individual rods of tin must be thick, compared to the continuous annular layers of tin of the invention. It is found that such relatively thick layers tend to melt during the heat-treatment used to form the Nb$_3$Sn, while the thin layers of the invention do not. Moreover, if a given amount of Sn is disposed in several layers as taught by the present invention, agglomeration of Sn is avoided; this in turn reduces the porosity of the final product, which is therefore stronger, and reduces the tendency of the soft Sn to deform nonuniformly. The invention further provides for symmetric distribution of Sn around the Nb cores, thus insuring uniformly thick Nb$_3$Sn layers.

Figure 3:
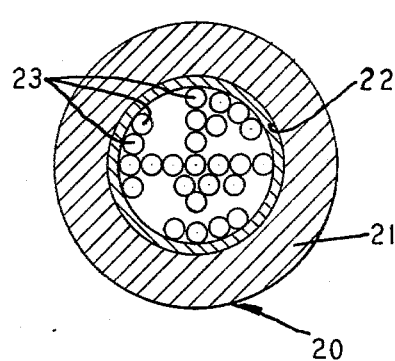
FIG. 3 represents one embodiment of the product of the invention, prior to extrusion.

Referring now to FIG. 3, which represents a cross-sectional view of the product of the invention at an intermediate state, a number of rods 23, similar to those shown in either FIG. 1 or FIG. 2, are shown having been packed into a copper extrusion can 21 lined with a barrier layer 22, typically formed of tantalum. This packed can 20 may then be sealed and extruded to a rod, which is then drawn to a final size, and heat-treated to form Nb$_3$Sn filaments embedded in a bronze matrix, sheathed in tantalum, and enclosed in high conductivity copper. Alternatively, a "double extrusion" process may be performed, where the composites of FIG. 3 are extruded and drawn as above but are then cut into lengths, repacked into a second extrusion can, re-extruded and redrawn; this process would of course yield many more filaments. In such a case it may be possible to line only the second extrusion can with tantalum, depending on the amount of stabilizing Cu necessary in the final product.

Figure 4:
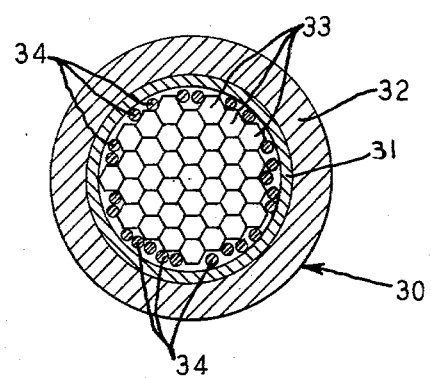
FIG. 4 represents a second embodiment of the product prior to extrusion.

A second embodiment similar to that of FIG. 3 is shown in FIG. 4. There the stock product 33 of either FIG. 1 or 2 is shown having been hexed, by drawing through hex dies, and packed into a Cu extrusion can 32 lined with Ta 31. The spaces between the hexed rods and the inner surface of the can 32 may be filled with appropriately-shaped pieces of copper 34. Alternatively, a bundle of the hex-shaped rods may be held together by clamps or by soldering, and turned to the shape of a cylinder, so that they fit snugly in an extrusion can without the necessity of filler pieces. Preferably, the outermost hexed rods are of pure copper, so that no superconductive material is wasted in the machining process.

As described above in the discussion of FIG. 3, a double extrusion process may be used with the hex rods of FIG. 4; that is, the individual rods 33 are themselves the assemblies of FIG. 4, after extrusion, drawing and cutting to length.

Figure 5:
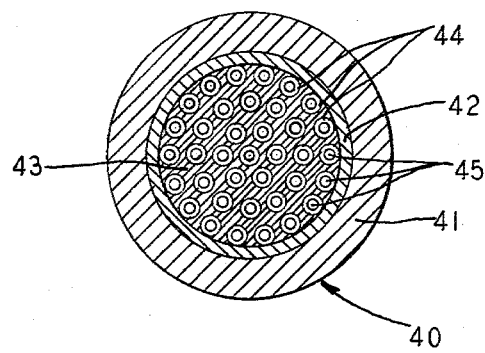
FIG. 5 represents a cross-sectional view of the product of the invention in finished form.

As in FIG. 3, the assembly 30 of FIG. 4 is typically extruded and drawn to fine wire before the heat-treatment which forms both the bronze matrix and the Nb$_3$Sn filaments. The finished product 40, produced according to either FIG. 3 or FIG. 4, is shown in FIG. 5. A plurality of Nb$_3$Sn filaments 44, formed around cores of unreacted Nb 45 are embedded in a bronze matrix 43, which is separated from an outer layer of copper 41 by a tantalum barrier layer 42. Were the alternative double extrusion method described above used, the structure of FIG. 5 interior of copper sheath 41 would be subdivided by a honeycomb structure, the honeycomb being formed of copper; each cell would be lined with tantalum and be filled with Nb$_3$Sn filaments embedded in bronze.

It will have been observed that according to the practice of the process of the invention, no bronze is formed until the final heat-treatment is performed; as the copper, tantalum, tin and niobium metals of the intermediate stages do not work-harden beyond a given point, which permits of further working without further hardening, no annealing is necessary. Thus a great saving of time, and therefore of cost, is achieved. In some cases it may be preferable to perform the heat-treatment in two stages, as discussed in U.S. Pat. No. 3,954,572, one to form bronze from the copper and tin, and one to form Nb$_3$Sn. It may also be desirable in some cases to use a "tin" which is actually up to 20% by weight copper, so as to strengthen the material somewhat, as pure tin is rather soft.

Finally, although the major part of this specification has been written in terms of Nb$_3$Sn, it will be recognized by those skilled in the art that V$_3$Ga and its components behave very similarly to Nb$_3$Sn; therefore, the processes described as applicable to Nb$_3$Sn are equally useful for making V$_3$Ga.

There will also be numerous other modifications to the method of the invention as described which will occur to those skilled in the art. In particular, the process has been described in terms of round conductors which are worked mainly by drawing. However, the process of the invention is useful in connection with conductors of all shapes which are mechanically worked to a given final shape and size and which rely on intermetallic diffusion to form the superconductive material; for example, tape-like conductors are made by the bronze process, and are formed mainly by rolling. The process of the invention is readily adaptable to such conductors.

Therefore this description of the process of the invention should be construed broadly, to cover all that comes within the scope and spirit of the following claims.

We claim:
1. In the method of manufacturing a composite multi-filamentary superconductor of the type A$_3$B where A is selected from the group consisting of Nb and V, and B is selected from the group consisting of Sn and Ga by
   (a) forming a composite billet having a plurality of filaments of A embedded in a matrix of Cu and having a source of B external to the Cu matrix,
   (b) extruding said composite billet to reduce its cross sectional area and increase its length,
   (c) wire drawing the extruded product to the final conductor cross sectional area, and
   (d) heat treating the so reduced conductor to cause the B material to diffuse into and through the Cu and react with the filaments of A to form A$_3$B,
   the improvement which comprises
      providing the B material external to the Cu matrix in the preextrusion billet in the form of surrounding concentric uniform thickness annual layers of B surrounded by concentric annular layers of Cu, the thickness of B being approximately, but not exceeding, 0.50 mm per layer, and
      providing a plurality of such layers of B material and Cu, the number of such layers being determined by the total amount of B material required to react with the available A material to form A$_3$B.

* * * * *

UNITED STATES PATENT AND TRADEMARK OFFICE
CERTIFICATE OF CORRECTION

PATENT NO. : 4,224,735
DATED : September 30, 1980
INVENTOR(S) : Morris S. Young and William G. Marancik It is certified that error appears in the above-identified patent and that said Letters Patent are hereby corrected as shown below:

The title "METHOD OF PRODUCTION MULTIFILAMENTARY INTERMETALLIC SUPERCONDUCTORS"

should read

-- METHOD OF PRODUCTION OF MULTIFILAMENTARY INTERMETALLIC SUPERCONDUCTORS --.

Column 1, line 20, "supperconductive" should read

-- superconductive --.

Column 6, line 57, "annual" should read -- annular --.

Signed and Sealed this

Third Day of February 1981

[SEAL]

Attest:

RENE D. TEGTMEYER

Attesting Officer        Acting Commissioner of Patents and Trademarks